United States Patent
Bergström et al.

(10) Patent No.: US 10,610,942 B2
(45) Date of Patent: Apr. 7, 2020

(54) METHOD AND DEVICE FOR JETTING DROPLETS

(71) Applicant: Micronic Mydata AB, Taby (SE)

(72) Inventors: Andreas Bergström, Stockholm (SE); Eric Eskång, Stockholm (SE); Johan Bergström, Stockholm (SE); Martin Dahlberg, Landvetter (SE)

(73) Assignee: Mycronic AB, Taby (SE)

( * ) Notice: Subject to any disclaimer, the term of this patent is extended or adjusted under 35 U.S.C. 154(b) by 0 days.

(21) Appl. No.: 14/775,212

(22) PCT Filed: Mar. 13, 2013

(86) PCT No.: PCT/EP2013/055182
§ 371 (c)(1),
(2) Date: Sep. 11, 2015

(87) PCT Pub. No.: WO2014/139568
PCT Pub. Date: Sep. 18, 2014

(65) Prior Publication Data
US 2016/0031030 A1    Feb. 4, 2016

(51) Int. Cl.
*B23K 3/06* (2006.01)
*B05C 11/10* (2006.01)
(Continued)

(52) U.S. Cl.
CPC .......... *B23K 3/0638* (2013.01); *B05B 12/082* (2013.01); *B05C 5/02* (2013.01);
(Continued)

(58) Field of Classification Search
None
See application file for complete search history.

(56) References Cited

U.S. PATENT DOCUMENTS

| 3,907,429 A | 9/1975 | Kuhn et al. |
| 4,217,594 A | 8/1980 | Meece et al. |

(Continued)

FOREIGN PATENT DOCUMENTS

| JP | S63-194953 A | 8/1988 |
| JP | H03-188966 A | 8/1991 |

(Continued)

OTHER PUBLICATIONS

International Search Report PCT/ISA/210 for International Application No. PCT/EP2013/055182 dated Nov. 28, 2013.

(Continued)

*Primary Examiner* — Jethro M. Pence
(74) *Attorney, Agent, or Firm* — Harness, Dickey & Pierce, P.L.C.

(57) ABSTRACT

An ejector for jetting droplets of viscous media onto a substrate is disclosed. The ejector comprises a jetting nozzle having a nozzle space and a nozzle outlet, and an impacting device for impacting a volume of the viscous medium in the nozzle space such that droplets of viscous medium is jetted from the nozzle space through the nozzle outlet towards the substrate. The ejector also comprise a sensor arrangement arranged after the jetting nozzle in the jetting direction, wherein the sensor arrangement is adapted to detect a jetted droplet of viscous medium passing thereby.

13 Claims, 10 Drawing Sheets

(51) Int. Cl.
  *B05C 5/02* (2006.01)
  *H05K 3/32* (2006.01)
  *H05K 3/34* (2006.01)
  *B41J 2/14* (2006.01)
  *H05K 3/12* (2006.01)
  *B05B 12/08* (2006.01)
  *H05K 3/30* (2006.01)
  *H05K 13/04* (2006.01)

(52) U.S. Cl.
  CPC ........ *B05C 5/0225* (2013.01); *B05C 11/1007* (2013.01); *B05C 11/1034* (2013.01); *B23K 3/0623* (2013.01); *B41J 2/14* (2013.01); *H05K 3/125* (2013.01); *H05K 3/321* (2013.01); *H05K 3/3484* (2013.01); *H05K 3/3489* (2013.01); *B41J 2002/14354* (2013.01); *B41J 2002/14483* (2013.01); *H05K 3/305* (2013.01); *H05K 13/0469* (2013.01); *H05K 2203/013* (2013.01); *H05K 2203/163* (2013.01)

(56) References Cited

U.S. PATENT DOCUMENTS

| | | | |
|---|---|---|---|
| 4,935,261 | A | 6/1990 | Srivastava et al. |
| 5,320,250 | A * | 6/1994 | La .................. B05C 5/0225 222/1 |
| 5,505,777 | A | 4/1996 | Ciardella et al. |
| 5,711,989 | A | 1/1998 | Ciardella et al. |
| 5,913,455 | A | 6/1999 | La et al. |
| 6,213,356 | B1 | 4/2001 | Nakasu et al. |
| 2003/0202055 | A1 | 10/2003 | Jeanmaire et al. |
| 2005/0167519 | A1 | 8/2005 | Holm et al. |
| 2007/0014974 | A1 | 1/2007 | Vronsky |
| 2009/0122110 | A1 | 5/2009 | Yoshioka |
| 2011/0017841 | A1 | 1/2011 | Holm et al. |
| 2011/0187785 | A1 | 8/2011 | Inoue |
| 2013/0113863 | A1 | 5/2013 | Kodama et al. |

FOREIGN PATENT DOCUMENTS

| | | | | | |
|---|---|---|---|---|---|
| JP | 8-309963 | A | | 11/1996 | |
| JP | 2002-103627 | A | | 4/2002 | |
| JP | 2003127430 | A | | 5/2003 | |
| JP | 2003-159824 | A | | 6/2003 | |
| JP | 2004-148180 | | * | 5/2004 | ............... B05C 5/00 |
| JP | 2004-148180 | A | | 5/2004 | |
| JP | 2004148180 | A | * | 5/2004 | ............ B05C 11/10 |
| JP | 2004-174845 | A | | 6/2004 | |
| JP | 2004-358353 | A | | 12/2004 | |
| JP | 2006-136836 | A | | 6/2006 | |
| JP | 2007179880 | A | * | 7/2007 | ............ B05C 11/10 |
| JP | 2007326003 | A | | 12/2007 | |
| JP | 2009-98117 | A | | 5/2009 | |
| JP | 2009-112884 | A | | 5/2009 | |
| JP | 2010-094615 | A | | 4/2010 | |
| JP | 2010-274637 | A | | 12/2010 | |
| JP | 2012-11310 | A | | 1/2012 | |
| JP | 2012-050968 | A | | 3/2012 | |
| JP | 2013035138 | A | | 2/2013 | |
| WO | WO-2009/104398 | A1 | | 8/2009 | |

OTHER PUBLICATIONS

Office Action for corresponding U.S. Appl. No. 15/455,801 dated Apr. 16, 2018.
Japanese Office Action dated Jan. 30, 2018 issued in corresponding Japanese Application No. 2015-561949 (with translation).
Chinese Office Action dated Jun. 28, 2017 issued in corresponding Chinese Application No. 201380076352.9 (with translation).
Japanese Office Action dated May 9, 2017 in Japanese Application No. 2015-561949 (with translation).
Japanese Office Action dated Sep. 27, 2018 issued in corresponding Japanese Application No. 2017-154430 (with Translation).
U.S. Office Action dated Jun. 7, 2019 in corresponding U.S. Appl. No. 15/455,801.
U.S. Office Action dated Nov. 26, 2018 issued in U.S. Appl. No. 15/455,801.
Japanese Office Action dated May 7, 2019 for corresponding Japanese Application No. 2017-154430.
U.S. Office Action dated Jan. 7, 2020 for corresponding U.S. Appl. No. 15/455,801.

* cited by examiner ly limited ability to detect small variations of volume and the time consumption and complexity of such inspection is however a drawback associated with such techniques.

METHOD AND DEVICE FOR JETTING DROPLETS

TECHNICAL FIELD

The invention disclosed herein relates to jetting of viscous medium onto a substrate. More precisely, it relates to an ejector for jetting droplets of viscous medium onto a substrate, as well as a method for jetting such droplets.

BACKGROUND

Ejectors and methods are known in the art for jetting droplets of viscous medium of fluid, e.g. solder paste or adhesive, onto a substrate, e.g. a printed wiring board (PWB), thus forming deposits on the substrate prior mounting components thereon. Such an ejector generally comprises a nozzle space for containing a volume of the viscous medium prior to the jetting thereof, a jetting nozzle communicating with the nozzle space, an impacting device for impacting and jetting the viscous medium from the nozzle space through the jetting nozzle in the form of droplets, and a feeder for feeding the medium into the nozzle space.

The amount, or volume, of the deposited viscous medium at different locations of the substrate may be varied by applying several drops on top of each other, thus forming a larger deposit, or by varying the volume of the jetted droplet by e.g. feeding a larger or smaller volume of the viscous medium into the nozzle space.

High production speed and reliability are factors of interest for the manufacturing of e.g. printed circuit board (PCB) assemblies. In order to increase the production speed, which e.g. can be measured in terms of throughput time or mounted components per hour (cph), the application of viscous medium can be performed "on the fly", i.e. without stopping for each location on the substrate where viscous medium is to be deposited. The reliability, such as e.g. the accuracy and repeatability of the jetting process, is of interest due to its effects on the performance and the quality of the final product, such as e.g. the PCB assembly. Too small volumes of deposited medium may e.g. lead to dry joints or loosening components, whereas too large volumes of deposited medium may lead to short-circuiting caused by e.g. solder balls, or defective contacts due to contamination of adhesive.

To increase process reliability, an optical or visual inspection such as e.g. manual inspection or Automatic Optical Inspection (AOI) is performed after the viscous medium has been jetted onto the substrate. The relatively limited ability to detect small variations of volume and the time consumption and complexity of such inspection is however a drawback associated with such techniques.

Although such an inspection may provide increased process reliability, there is still a need for providing an ejector and method that would address at least some of the above mentioned issues.

SUMMARY

An object of the technology disclosed is to provide an improved and more reliable and effective ejector for, and method of, jetting droplets of viscous medium onto a substrate.

This and other objects of the technology disclosed are achieved by means of an ejector and a method having the features defined in the independent claims. Different implementations of the technology disclosed are defined in the dependent claims.

Hence, according to a first aspect of the technology disclosed, an ejector for jetting droplets of viscous media onto a substrate is provided. The ejector comprises a nozzle having a nozzle space and a nozzle outlet, and an impacting device for impacting a volume of the viscous medium in the nozzle space such that the volume of the viscous medium is forced through the nozzle outlet. Thereby droplets of viscous medium are jetted from the jetting nozzle towards the substrate. The ejector also comprises a sensor arrangement, arranged along a path of the jetted droplets of the viscous medium, adapted to detect passage of the jetted droplets of the viscous medium towards the substrate.

According to a second aspect of the technology disclosed, a method of jetting droplets of viscous medium onto a substrate is provided, wherein a jetting nozzle comprising a nozzle space and a nozzle outlet is provided. A sensor arrangement is provided after the jetting nozzle in the jetting direction, or along a path of the jetted droplets of viscous medium. The viscous medium is fed into the nozzle space and impacted such that the viscous medium is jetted from the nozzle space in the form of droplets through the nozzle outlet towards the substrate. The method further comprises monitoring a sensor parameter reflecting presence of viscous medium at the sensor arrangement.

The technology disclosed is based on a realisation that by arranging a droplet sensor arrangement between the jetting nozzle and the substrate, onto which the jetted droplets of viscous media is deposited, the jetting characteristics and the jetted droplets can be monitored during the jetting process. Information may be obtained, comprising e.g. information on whether droplets are jetted or not due to an impact of the impacting device. Thereby missed drops may be detected without inspection of the surface of the substrate. If a jetted droplet due to an impact of the impacting device is not verified, the information may be used for correction of the deposited volume by e.g. adding supplementary medium to the substrate. The correction may be performed simultaneously or on the fly, during the present printing process, or in an additional, supplementary printing process. Thereby the need for time consuming downstream, posterior inspection of the deposits may be reduced.

The technology disclosed is also advantageous in that it provides a relatively thorough real-time, or instantaneous, monitoring of the volume of the deposited viscous medium. More specifically, the volume applied to a certain location on the substrate may be estimated by counting the number of the jetted drops that together form the deposited volume, or by estimating the volume of individual droplets. Thus, the technology disclosed enables the volume of the deposited medium to be estimated with an accuracy of the volume of a single jetted drop without using any additional, downstream optical inspection equipment.

In the context of the present application, it is to be noted that the term "viscous medium" should be understood as solder paste, solder flux, adhesive, conductive adhesive, or any other kind of medium of fluid used for fastening components on a substrate, conductive ink, resistive paste, or the like, and that the term "jetted droplet", or "shot" should be understood as the volume of the viscous medium that is forced through the jetting nozzle and moving towards the substrate in response to an impact of the impacting device. The jetted droplet may also include a cluster of droplets jetted due to an impact of the impacting device. It is also to be noted that the term "deposit", or a volume of "deposited medium", refers to a connected amount of viscous medium applied at a position on a substrate as a result of one or more jetted droplets, and that the term "substrate" should be interpreted as a printed wiring board (PWD), a printed circuit board (PCB), a substrate for ball grid arrays (BGAs), chip scale packages (CSP), quad flat packages (QFP), wafers, flip-chips, or the like.

It is also to be noted that the term "jetting" should be interpreted as a non-contact dispensing process that utilises a fluid jet to form and shoot droplets of a viscous medium from a jetting nozzle onto a substrate, as to compare to a contact dispensing process, such as "fluid wetting".

Typically, the ejector is software controlled. The software needs instructions for how to apply the viscous medium to a specific substrate or according to a predetermined jetting schedule or jetting process. These instructions are called a "jetting program". Thus, the jetting program supports the process of jetting droplets of viscous medium onto the substrate, which process also may be referred to as "jetting process" or "printing process". The jetting program may be generated by a pre-processing step performed off-line, prior to the jetting process.

Thus, the generation of the jetting program involves importing, to a generation program, substrate data relating to a unique or predetermined substrate, or a unique or predetermined set of identical substrates; and defining, on basis of the substrate data, where on the substrate the droplets are to be jetted. In other words, viscous medium is arranged to be jetted onto the substrate according to a predetermined jetting program.

As an example, a computer program is used for importing and processing CAD data or the like about a substrate. The CAD data may e.g. comprise data representing position and extension of contact pads, as well as data representing position, name, and leads of each individual component that is to be mounted on the substrate. The program can be used to determine where on the substrate the droplets are to be jetted, such that each component is provided with deposits having the required volume, lateral extension, and/or height. This is a process which requires knowledge of the size and volume of a single droplet, how many droplets that will be sufficient for covering the needs of a specific component, and where on the substrate each droplet should be placed.

When all droplet configurations for all components have been programmed, a jetting path template may be generated, which describes how the jetting nozzle is going to be moved, e.g. by a jetting machine operating one or more ejectors, in order to jet the droplets of viscous medium onto the substrate. It is understood that the ejectors may operate concurrently or consecutively. The jetting path template is transferred to the jetting program which is used for running the jetting machine, and hence the ejector(s), accordingly. The jetting program may also comprise jetting parameters, e.g. for controlling the feeding of the viscous medium into the nozzle space, and for controlling the impact of the impacting device, in order to provide the substrate with the required deposits.

The pre-processing step that generates the jetting program may involve some manual steps performed by an operator. This may e.g. involve importing the CAD data and determining where on a pad the droplets should be positioned for a specific component. It will however be realized that the preprocessing may be performed automatically by e.g. a computer.

The sensor arrangement may comprise sensor devices configured to use disturbances of a sensor controlled fields, such as e.g. electromagnetic field controlled by a photosensor, electrical field controlled by a capacitive sensor, and magnetic field controlled by e.g. a magnetoresistive or a hall sensor. The sensor arrangement may also be realised by placing a microphone or pressure sensor in an air knife or an existing gaseous flow. It will be appreciated that the ejector may comprise further sensor arrangements or sensor devices, such as e.g. temperature or pressure sensors, which may improve the monitoring and control of the jetting process.

A single missed, or absent, shot or a plurality of subsequently missed shots, may be caused by e.g. air voids enclosed in the viscous medium, by a discontinuity in the supply of medium to the nozzle chamber, or a defective ejector. In prior art technology, a substrate having a defective printing result (i.e. having missing deposits or deposits of wrong or inadequate volume) may be detected after the deposition of viscous medium, e.g. in a downstream inspection step or during a final testing of the product. There is hence a risk that several substrates having a defective printing result are processed before the errors are detected and therefore have to be reworked or discarded.

The present invention is thus advantageous in that it provides the possibility to monitor the jetting of droplets during the jetting process or jetting program such that interruptions or disturbances of the jetting process can be detected during the jetting process in real time or at least early. Thereby potential defects of the printing result may be detected prior to forwarding the substrates downstream the processing line, which may improve the production yield, reduce the rejection rate, and reduce the reworking of substrates.

The technology disclosed is also advantageous in that it provides the possibility to save additional, downstream inspection steps such as e.g. manual inspection or Automatical Optical Inspection (AOI). Reducing the number of tools of the production line, and/or the number operators may advantageously reduce production costs.

In-process detection of the jetted drops enables detection of the smallest applied amount, i.e. the single jetted drops that form a deposit, prior to application of the viscous medium to the surface of the substrate. This enables an improved process control and an improved monitoring of the volume of the deposited viscous medium.

The technology disclosed is also advantageous in that it provides the possibility to correct printing errors by supplemental jetting of droplets of the viscous medium onto the substrate without performing a separate inspection.

A gaseous flow may be provided past an outlet of the jetting nozzle, the magnitude and the velocity of the gaseous flow being sufficient for transporting viscous medium away from the area at the nozzle outlet with the gaseous flow. Furthermore, the ejector may be provided with a wall, or vacuum washer, being spaced apart from the nozzle outlet and located after, or downstream, the nozzle outlet seen in the jetting direction. Between the vacuum washer and the nozzle outlet there is formed a space acting as a channel or guide for the gaseous flow at and past the nozzle outlet. The vacuum washer is provided with an opening or orifice, concentric with the nozzle outlet, which allows the jetted droplets to pass through the vacuum washer via the orifice. Preferably, the orifice of the vacuum washer also provides an inlet for the gaseous flow towards and past the nozzle outlet.

According to an implementation of the technology disclosed, the detector is integrated with the vacuum washer. By e.g. arranging the detector in the (windswept) wall of the suction hole, or orifice, the gaseous flow may keep the ejector sufficiently clean from contamination by the viscous medium. This advantageously may enhance the reliability of the jetting process and reduce the risk for interruption or disturbance in the jetting process due to clogging of any surface of the detector.

Integrating the detector in an existing part of the ejector, such as the vacuum washer, may be advantageous from an ejector production point of view.

According to different implementations of the technology disclosed, the detector comprises an optical detector. The detector may further comprise a plurality of optical detectors which may be arranged in a plane perpendicular to the path of the jetted droplets, and/or arranged consecutively along the path of the jetted droplets. The optical detector(s) may comprise a light source, e.g. a light emitting element (LED) emitting light or other electromagnetic energy, and a photosensor detecting the emitted light.

Arranging a plurality of detectors perpendicular to the path of the jetted droplets, e.g. around the orifice of the vacuum washer, may advantageously enhance reliability and redundancy of the detection of passing droplets.

Furthermore, arranging a plurality of consecutive detectors along the path of the jetted droplets provides a possibility of detecting the jetted droplets at several positions along their path towards the substrate. This may enhance reliability and redundancy, and enables retrieval of other parameters such as e.g. length and velocity of the shot.

According to an implementation of the technology disclosed, the ejector may comprise a further detector directed towards the substrate in order to detect drops of viscous medium on the surface of the substrate, and to measure shape and/or width of the drops and/or the deposits. This advantageously allows for enhanced reliability and redundancy of the jetting process and the detection of potential errors.

According to an implementation of the technology disclosed, the step of monitoring comprises calculating at least one presence value (PV) by comparing at least one sensor value (SV) of the sensor parameter with at least one reference sensor value (SVref). The sensor value may indicate disturbances and blocking of the sensor controlled field which is intersected by the path of the jetted droplets. By comparing the sensor value (SV) received from the sensor device with a reference sensor value (SVref), or threshold, presence or absence of viscous medium at the sensor arrangement can hence be identified and represented by the presence value (PV).

According to an implementation of the technology disclosed, the method further comprises the step of calculating a droplet value (DV). The calculation includes a comparison between at least two presence values (PV) measured at different times. By comparing two presence values with each other enables a droplet of viscous medium passing the sensor arrangement to be identified. The identification may e.g. be performed by determining a difference between at least two presence values. For example, passage of a droplet may be identified as a first presence value indicating presence of viscous medium at the sensor arrangement and a second presence value indicating no presence of viscous medium at the sensor arrangement. Hence, a droplet value representing a droplet passing the sensor arrangement may be determined by identifying and analyzing a difference between presence values.

According to another implementation of the technology disclosed, the method further comprises calculating a droplet value (DV) by counting at least two presence values (PV) being equal to or exceeding reference presence value (PVref) representing presence of viscous medium at the sensor arrangement. The at least two presence values (PV) are measured at different times, thereby identifying a droplet of viscous medium passing the sensor arrangement. A droplet value representing a droplet passing the sensor arrangement may hence be obtained by identifying and counting presence values representing presence of viscous medium at the sensor arrangement. Counting a number of presence values (PV) advantageously enables e.g. satellites to be distinguished from the main droplet.

According to an implementation of the technology disclosed, the method comprises monitoring a lapsed time parameter (LTP) reflecting a lapsed time from the impacting of the viscous medium in the nozzle space to the identifying of a droplet of viscous medium passing the sensor arrangement, wherein the lapsed time parameter (LTP) including a time value (TV). An impact droplet value (IDV) is calculated by comparing the time value (TV) with a reference time value (TVref). By this comparing the time value with the reference time value, it may be determined if the detected droplet passed the sensor arrangement within a reasonable time interval from the impact of the impacting interval. Too long time interval may indicate that the droplet was not jetted due to the impact, and hence may be regarded e.g. as a missed shot. Analysing the time value may advantageously enable a velocity of the droplet to be calculated. The velocity may e.g. be determined by dividing the travelled distance of the droplet, i.e. the distance between the nozzle outlet and the sensor device. The time value may also be used for monitoring changes and variations in relative velocity between consecutively jetted droplets. A gradually increasing droplet velocity may e.g. be detected by correspondingly decreasing time values during the jetting process. Similarly, gradually decreasing velocities may be indicated by gradually increasing time values.

Alternatively, or additionally, the impact droplet value (IDV) representing passage of a droplet due to impact of the impacting device may obtained by comparing a droplet interval time value (DIV) of a droplet interval time parameter (DTP), which reflects a lapsed time between a first and a second droplet of viscous medium passing the sensor, with a reference droplet interval value (DIVref). The DIVref may e.g. be obtained from the jetting program which, as previously described, may comprise jetting parameters for controlling e.g. the impacting by the impacting device. By obtaining the lapsed time between a first and a second shot, and thus the reference droplet interval value (DIVref), it may be determined if a passing droplet was jetted due to the impact, as expected. If the difference between the droplet interval time value and its corresponding reference value is within a reference interval, it may e.g. be concluded that the second droplet was jetted in response to said impact.

According to an implementation of the technology disclosed, the sensor arrangement comprises at least two sensor devices consecutively arranged in the jetting direction. According to this implementation, a droplet velocity value (DVV) is calculated by a comparison between at least a first presence value (PV) from at least a first sensor device, and at least a second presence value (PV) from at least a second sensor device, wherein the at least first and second presence values (PV) are measured at different times.

The droplet velocity value, representing a velocity of the droplet at the passage of the sensor arrangement, may advantageously be used for as an indicative measure of the quality of the printing result and the jetting process. A relatively high droplet velocity may e.g. affect the printing result in terms of satellites and spreading on the substrate, whereas a relatively low droplet velocity may lead to irregularly shaped droplets upon impact on the substrate, and hence irregularly shape deposits. The droplet velocity may also be used as an indicative measure of the quality of the viscous medium, e.g. due to the velocity depending on the viscosity and density of the viscous medium. By monitoring the velocity of the jetted droplets, a instantaneous monitoring of e.g. the quality of the printing result, the performance of the ejector, and the quality of the viscous medium may be achieved.

Using a sensor arrangement comprising at least two sensor devices consecutively arranged in the jetting direction enables a droplet length value (DLV) to be calculated, wherein the droplet length value represents a length of the jetted droplet in relation to the jetting direction. The calculation includes comparing the at least first presence value (PV) from the at least a first sensor device with the at least second presence value (PV) from the at least second sensor device, wherein the a least first and second presence values (PV) are measured at different times.

According to an implementation of the technology disclosed, the sensor arrangement further comprises at least two sensors arranged in a plane perpendicular to the jetting direction. Such arrangement can be used to determine a droplet volume value (DVOLV) representing a volume of the jetted droplet. The calculation includes calculating a droplet diameter value (DDIAV) by comparing at least two presence values (PV) from at least a first and a second sensor device, wherein the at least two presence values are measured at the same time, and calculating a droplet a droplet length value (DLV) by comparing at least a first presence value (PV) from at least a first sensor device with at least a second presence value (PV) from at least a second sensor device, wherein the at first and second presence values (PV) are measured at different times. The droplet volume value (DVOLV) is then determined based on the droplet length value (DLV) and the droplet diameter value (DDIAV).

According implementations of the technology disclosed, supplemental jetting of a droplet of viscous medium onto the substrate is performed if a jetted droplet due to impact has not been verified, if the droplet velocity value (DVV) is below a droplet velocity reference value (DVVref), and/or if the droplet volume value (DVOLV) is below a droplet volume reference value (DVOLVref).

The supplemental jetting may, e.g., be performed during the present printing process. In such case, a jetting module may dynamically modify the jetting program, which controls the printing process, by adding one or several additional shots upon detection of one or several missed shots, or droplets having a volume being below a reference volume. Thus, potential errors may be automatically repaired without additional, subsequent processing and without intervention by an operator.

Alternatively, or additionally, the jetting module may prepare a repair jetting program based on information regarding missed shots and/or the volume of the jetted shots. The repair jetting program may be similar to the jetting program, i.e. controlling an associated jetting process in order to jet a required amount of viscous medium onto required positions on the substrate. In the repair jetting program, the required amounts and positions may however be based on the received information representing missed shots, or shots having low volume.

The repair jetting program may be generated in a similar way as the preprocessing of the jetting program, as outlined above. The generation may be performed automatically by e.g. a computer, or involve some manual steps performed by an operator. The machine may, e.g., display the position and/or number of detected missed shots, or deposits having unexpected volume, and allow for the operator to select which ones of the detected errors that should be repaired by additional jetting. The computer may then, based on the input from the operator, prepare a repair jetting program which may be executed by the ejector after the present jetting process is finished, or by another, concurrently or sequentially operating ejector.

Correcting the detected error may increase the robustness of the jetting technology and thus enhance the quality of the final products. It also may reduce the need for downstream inspection and testing of the deposits and reduce the reworking of the substrates.

Advantageously, the repairing process may be preceded by an automatic or manual validation of the ejector in response to detected errors, wherein the quality of the jetting may be verified by e.g. printing a test pattern or jetting droplets at a location beside the surface of the substrate.

It will be appreciated that the supplemental jetting may be performed in response to, e.g., detection of missed shots, detection of droplets having a volume being outside a predetermined reference volume range, and/or detection of droplets having a velocity being outside a predetermined reference velocity interval.

According to implementations of the technology disclosed, the strength of the impact of the viscous medium in the nozzle space may be increased if the droplet velocity value (DVV) is equal to or below a droplet velocity reference value (DVVref). Further, the strength of the impact may be reduced if the droplet velocity value (DVV) exceeds the droplet velocity reference value (DVVref).

The velocity of the jetted droplets may affect the quality of the printing results, inter alia in terms of volume distribution, or spreading, of the droplets on the substrate. High velocity of the jetted droplets may e.g. result in a relatively flat and wide deposit, while a lower velocity might lead to pointed drops having a relatively small diameter. Consequently, the distribution of the volume may affect the quality of the final product, wherein e.g. short-circuiting or dry joints may occur for viscous media comprising solder paste, and loosening components or non-conducting pads may be inherent in viscous media comprising e.g. adhesive.

The present implementation is thus advantageous in that is provides a possibility to adjust the velocity of the jetted droplets during the jetting process, and thereby enables final products, such as e.g. PCB assemblies, having a high quality and performance.

According to an implementation of the technology disclosed, the feeding rate of the viscous medium into the nozzle space is increased if the droplet volume value (DVOL) is equal to or below a droplet volume reference value (DVOLref). Similarly, the feeding rate may be reduced in response to the droplet volume value (DVOL) exceeding the droplet volume reference value (DVOLref).

As previously discussed, a deposit having too high volume of e.g. solder paste may cause short-circuiting, while too high volume of e.g. adhesive may lead to non-conducting pads. Furthermore, too low volume of e.g. solder paste or adhesive may lead to dry joints or loosening components, respectively. The present implementation is thus advantageous in that is provides a possibility to adjust the volume of the viscous medium deposited on the substrate, and thereby enables e.g. PCB assemblies having improved quality and performance.

According to an implementation of the technology disclosed, the method comprises providing a substrate sensor arrangement directed towards the substrate. A substrate sensor parameter (SSP) reflecting presence of viscous medium on the substrate is monitored, wherein the substrate sensor parameter (SSP) includes a substrate sensor value (SSV). The method further comprises calculating at least one substrate presence value (SPV), said calculation including a comparison between at least one substrate presence value (SPV) of said substrate sensor parameter (SSP) with at least one reference substrate presence value (SPVref). Thereby presence of viscous medium on the substrate is identified.

This implementation advantageously provides a possibility to verify a jetted droplet due to an impact of the impacting device, and consequently enables additional correction of the printing result upon detection of printing errors. Using a substrate sensor arrangement in combination with the sensor arrangement arranged along the path of the jetted drops may improve the reliability and redundancy of to the monitoring and control of the jetted droplets in terms of determining e.g. presence, velocity, diameter, and volume.

The technology disclosed may be embodied as computer-readable instructions for controlling a programmable computer in such manner that it performs the method outlined above. Such instructions may be distributed in the form of a computer-program product comprising a computer-readable medium storing the instructions.

It will be appreciated that any of the features in the embodiments described above for the ejectors according to the first aspect of the present invention may be combined with the method according to the second aspect of the present invention.

Further objectives of, features of, and advantages with, the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

The above, as well as additional objects, features and advantages of the present invention, will be better understood through the following illustrative and non-limiting detailed description of embodiments of the present invention. Reference will be made to the appended drawings, on which.

All the figures are schematic, not necessarily to scale, and generally only show parts which are necessary in order to elucidate the invention, wherein other parts may be omitted or merely suggested.

DETAILED DESCRIPTION

Figure 1A:
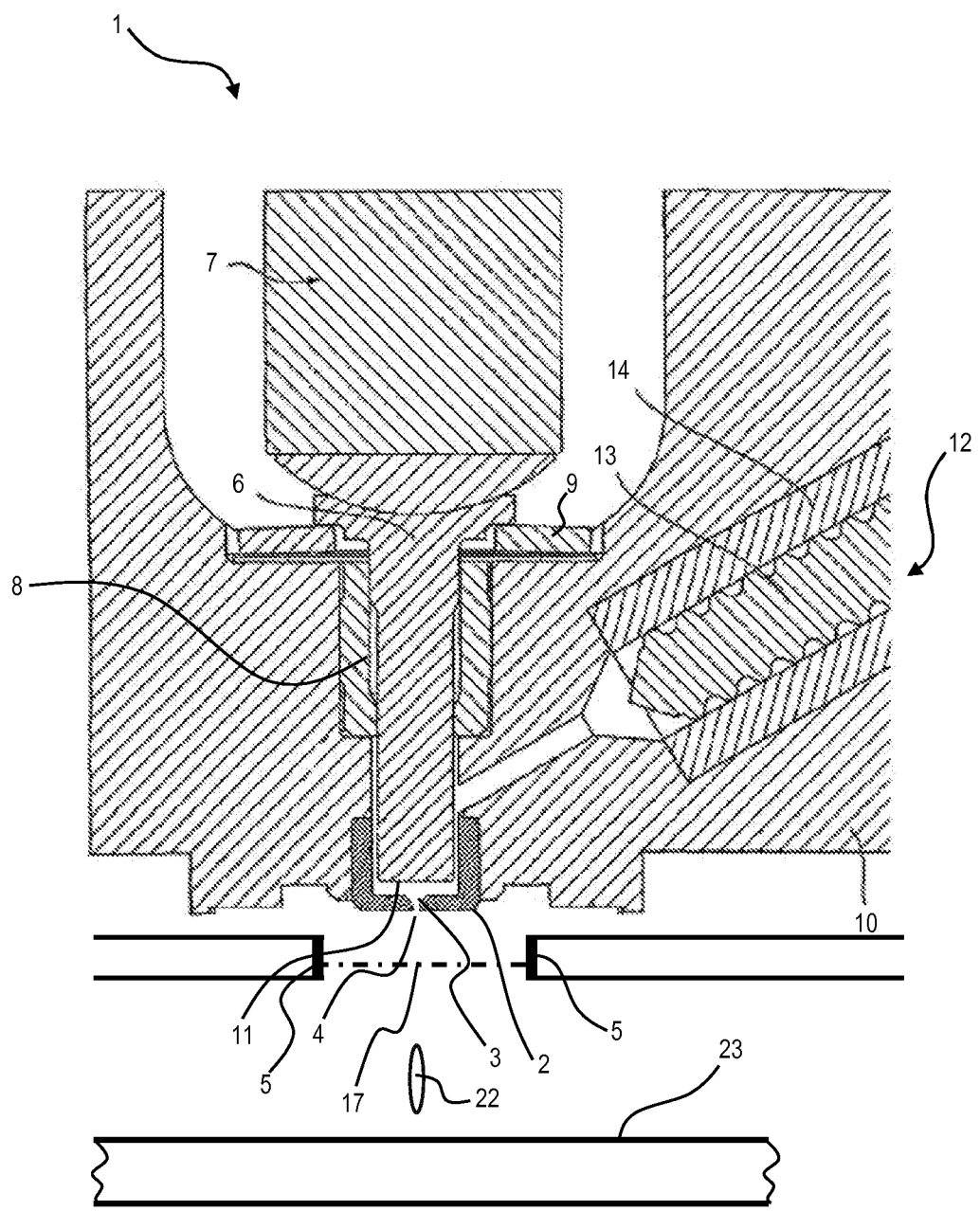
FIGS. 1a-c schematically show a cross sectional side view of a portion of an ejector according to different implementations of the technology disclosed.

With reference to FIG. 1a, there is shown a schematic view of an ejector according to an implementation of the technology disclosed.

The ejector 1 comprises an impacting device, which in this implementation includes a piezoelectric actuator 7 and a plunger 6, which is connected to the piezoelectric actuator 7. The plunger 6 is axially movable while slidably extending through a bore in bushing 8. Cup springs 9 are provided to resiliently balance the plunger 6 against the assembly housing 10, and for providing a preload for the piezoelectric actuator 7. An eject control unit (not shown) applies a drive voltage intermittently to the piezoelectric actuator 7, thereby causing an intermittent extension thereof, and hence a reciprocating movement of the plunger 6 with respect to the assembly housing 10, in accordance with solder pattern printing data.

Furthermore, the ejector 1 comprises an essentially plate shaped jetting nozzle 2 operatively directed against the substrate 23, onto which droplets 22 of viscous medium are to be jetted. In the jetting nozzle 23, there is provided a nozzle space 3 and a nozzle outlet 4 through which the droplets 22 are jetted towards the substrate 23. The nozzle outlet 4 is located at one end, a lower portion, of the nozzle 2. The nozzle space 3 is arranged for receiving viscous medium, which is forced through the nozzle space 3 and out of the nozzle outlet 4 upon an impact by the plunger 6 of the impacting device.

The impacting device in form of a plunger 6 comprises a piston portion which is slideably and axially movably extending through a piston bore, an impact end surface 11 of said piston portion of the plunger 6 being arranged close to said nozzle 2.

In other implementations of the technology disclosed using a different type of ejector(s), the plunger comprising a piston may be replaced by another type of impacting device such as e.g. a membrane or diaphragm, which may or may not also comprise an ejector control unit adapted to apply a drive voltage intermittently to a piezoelectric actuator in accordance with what is mentioned above.

All these impacting devices have in common that they are configured to provide for a non-contact jetting process to form and shoot droplets of a viscous medium from a jetting nozzle onto a substrate by quickly generating a pressure impulse by the reciprocating movement, or vibrating movement, of the impacting device, e.g. a plunger, membrane or diaphragm.

The impacting devices of the one or more ejector(s) used in connection with the technology disclosed may move from a starting position towards an end position (which may or may not be close to the nozzle of the ejector) during a time period of about 1-50 microseconds in order to shoot individual droplets having a deposit volume of between about 100 pL and about 30 nL, e.g. about 10 nL or within the size range 5-15 nL. The speed of the impacting device for impacting the jetting nozzle with a pressure impulse may be between about 5 m/s and about 50 m/s.

Hence, the one or more ejector(s) used in connection with the technology disclosed may be configured to shoot droplets having a deposit volume with a certain size or size range, e.g. 5-15 nL, 1-5 nL or 10-20 nL. As mentioned above, the volume of each individual droplet to be jetted onto the workpiece may be between about 100 pL and about 30 nL and the dot diameter for each individual droplet may be between about 0.1 mm and about 1.0 mm.

The upper surface of the nozzle 2 is positioned opposite to the impact end surface. Axial movement of the plunger 6 towards the nozzle 2, said movement being caused by the intermittent extension of the piezoelectric actuator 7, will cause a rapid pressurization and jetting through the nozzle outlet 4 of any viscous medium contained in the nozzle space.

Viscous medium is supplied to the nozzle space 3 a supply container, via a feeder 12. The feeder 12 comprises an electric motor (not shown) having a motor shaft 13 partly provided in a tubular bore, which extends through the ejector housing 10 to an outlet port communicating with the nozzle space. An essential portion of the rotatable motor shaft, or feed screw 13, is surrounded by a tube 14, made of an elastomer or the like, arranged coaxially therewith in the tubular bore, the threads of the rotatable feed screw 13 making sliding contact with the innermost surface of the tube. An electronic control signal provided by a supply control unit (not shown) to the motor causes the feed screw 13 to rotate a desired angle, or at a desired rotational speed. Viscous medium captured between the threads of the rotatable feed screw 13 and the inner surface tube are then made to travel from the inlet port to the nozzle space 3 in accordance with the rotational movement of the feed screw 13, thereby feeding viscous medium into the nozzle space 3.

A sensor arrangement 5 is arranged after the jetting nozzle 2, as seen in the direction of the jetted droplet 22, such that the path of the jetted droplet 22 intersects a sensor field 17 controlled by the sensor arrangement 5. Thus, the droplet 22 passing by the sensor arrangement 5 may cause a disturbance of the sensor controlled field 17 such that a presence of viscous medium may be detected.

Figure 1B:
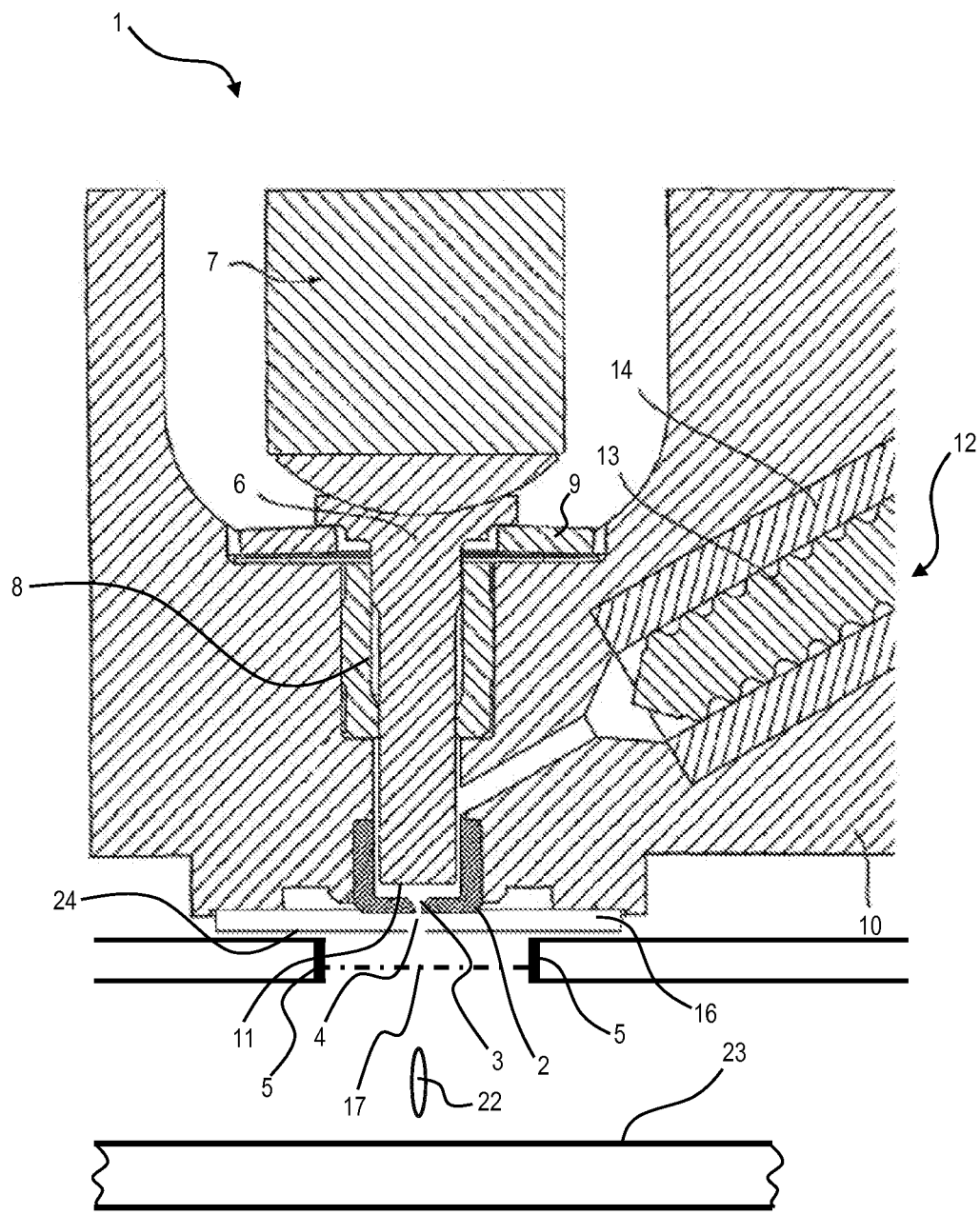

With reference to FIG. 1*b*, there is depicted an ejector 1 similar to the ejector as described with reference to FIG. 1*a*. According to FIG. 1*b*, the ejector may further comprise a wall, or vacuum washer 24, arranged below, or after, the nozzle outlet 4, as seen in the jetting direction. The vacuum washer 24 is provided with a through hole, or orifice, through which the jetted droplet 22 may pass without being hindered or negatively affected by the vacuum washer 24. Consequently, the hole is concentric with the nozzle outlet 4. The vacuum washer 24 is spaced apart from the nozzle outlet 4 such that an air flow chamber 16 is formed between the vacuum washer 24 and the nozzle outlet 4, acting as a channel or guide which enables a gaseous flow towards and past the nozzle outlet 4.

Figure 1C:
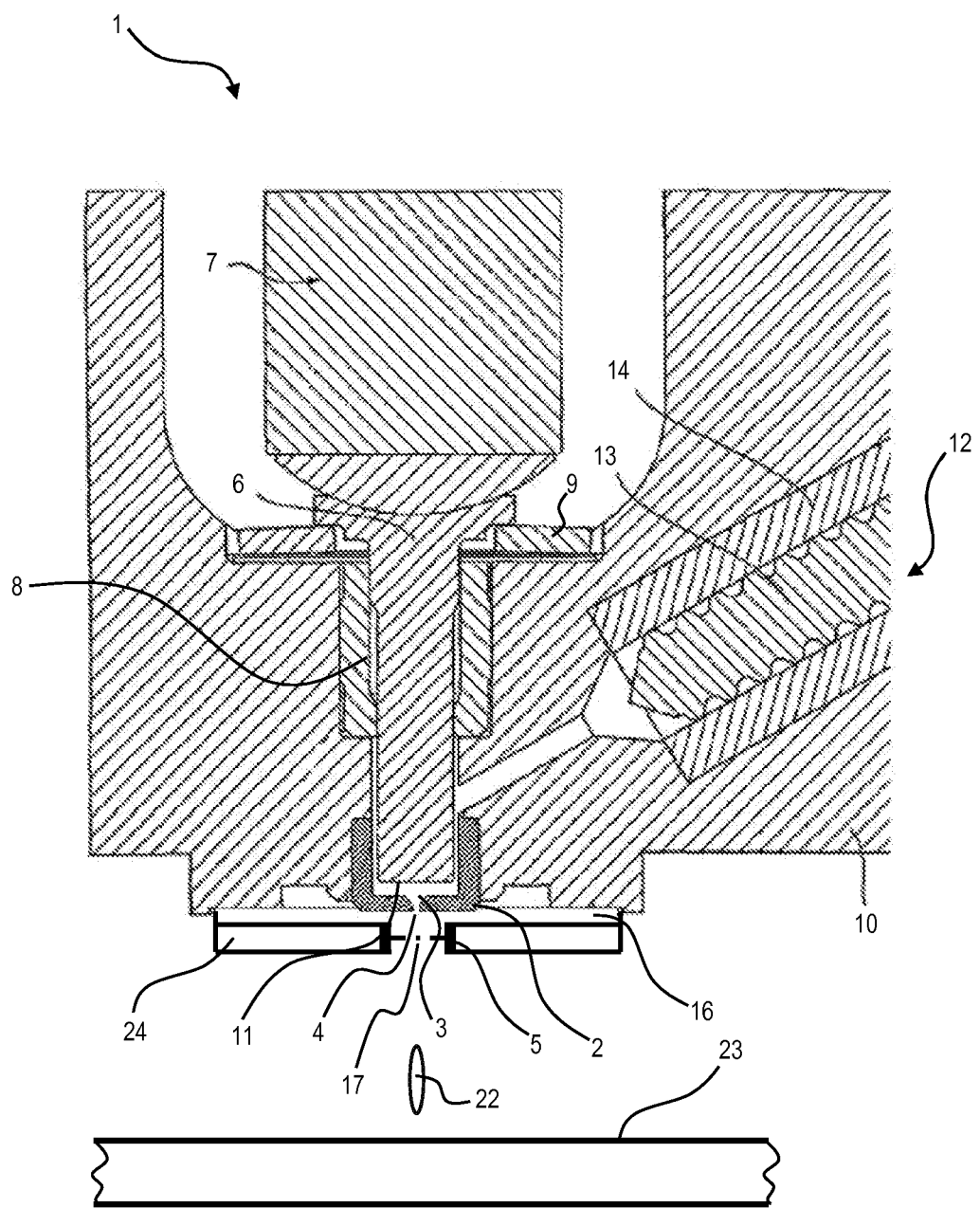

FIG. 1*c* depicts a further ejector 1 similar to the ejectors as previously described with reference to FIG. 1*a* and *b*. As indicated in FIG. 1*c*, the sensor arrangement 5 may be integrated with the vacuum washer 24.

Figure 2:
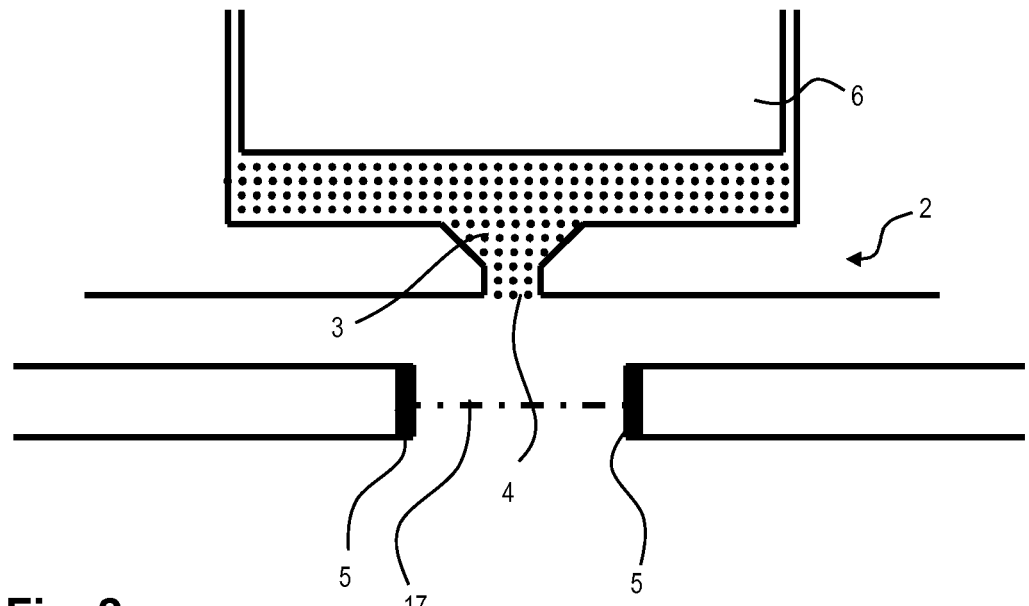
FIGS. 2 and 3 show two possible sensor arrangements for detecting a passing droplet.

With reference to FIG. 2, a jetting nozzle 2, a piston 6, and a sensor arrangement 5 is depicted in accordance with an implementation of the technology disclosed. The jetting nozzle 2 comprises a nozzle space 3 provided with a volume of viscous medium, which, upon impact by the impacting device, is forced through the nozzle outlet 4. Thereby a jetted droplet 22 of the viscous medium is expelled from the jetting nozzle 2 and passing through an optical field 17 controlled by the sensor arrangement, comprising e.g. an optical sensor. The droplet 22 passing by the sensor arrangement 5 may cause a disturbance of the sensor controlled field 17, such that a presence of viscous medium may be detected.

Figure 3:
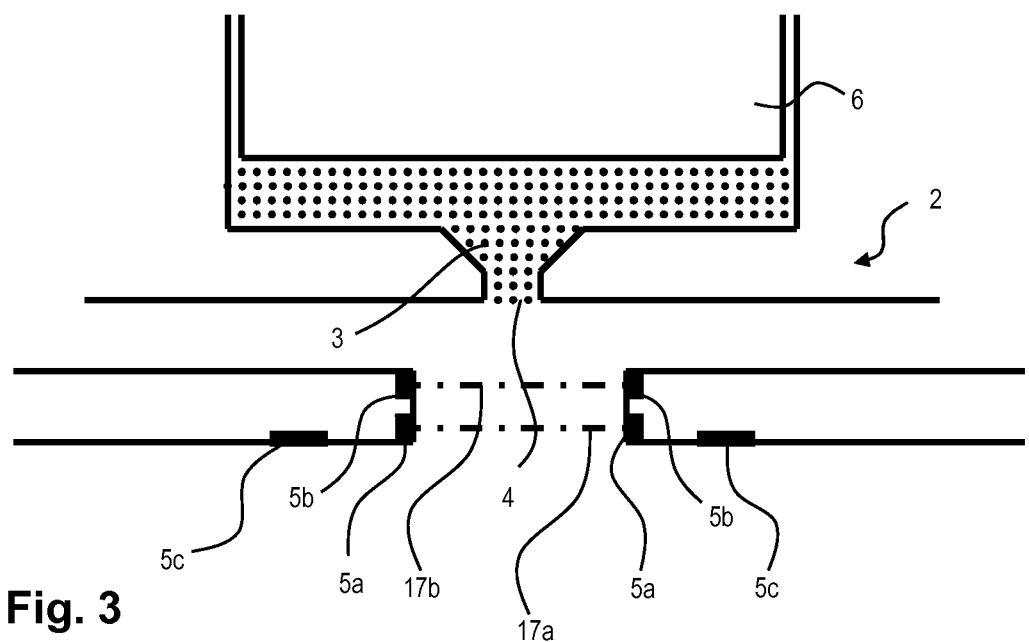

A similar arrangement as described with reference to FIG. 2 is shown in FIG. 3, wherein a first and second sensor arrangement 5*a*, 5*b* is consecutively arranged in the jetting direction. The path of the jetted droplet hence intersects two sensor controlled fields 17*a*, 17*b*, such that at least two different and time separated sensor signals may be generated upon passage of the droplet 22. A substrate sensor arrangement 5*c* is directed towards the substrate 23 so as to enable detection of viscous medium on the substrate 23.

It will however be appreciated that the sensor arrangement 5 may comprise a plurality of sensor devices consecutively arranged in the jetting direction, which may be integrated with a vacuum washer 24 or not integrated with the same.

Figure 4:
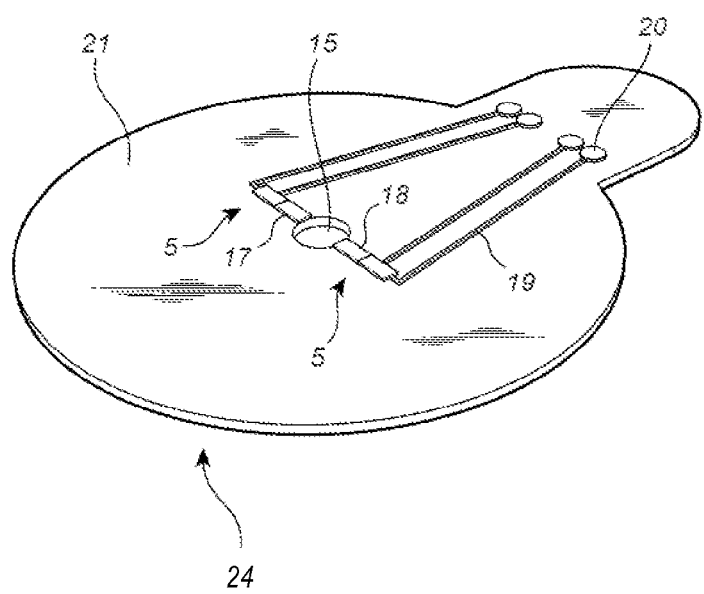
FIG. 4 is a perspective view of a vacuum washer comprising a silicon chip and a sensor arrangement.

Turning now to FIG. 4, the vacuum washer 24 may comprise a silicon chip 21 having a suction hole 15 and a sensor device 5 arranged across the suction hole 15, wherein the sensor 5 device includes a light emitting diode (LED) 17 and an oppositely arranged photo sensor 18. The LED 17 and the photo sensor 18 are connected to electric wirings 19 for transferring electric power and sensor signals to and from the surroundings via electric contact pads 20. The vacuum washer 24 and the integrated sensor arrangement may be combined with any one of the embodiments as described with reference to FIG. 1-3.

Figure 5:
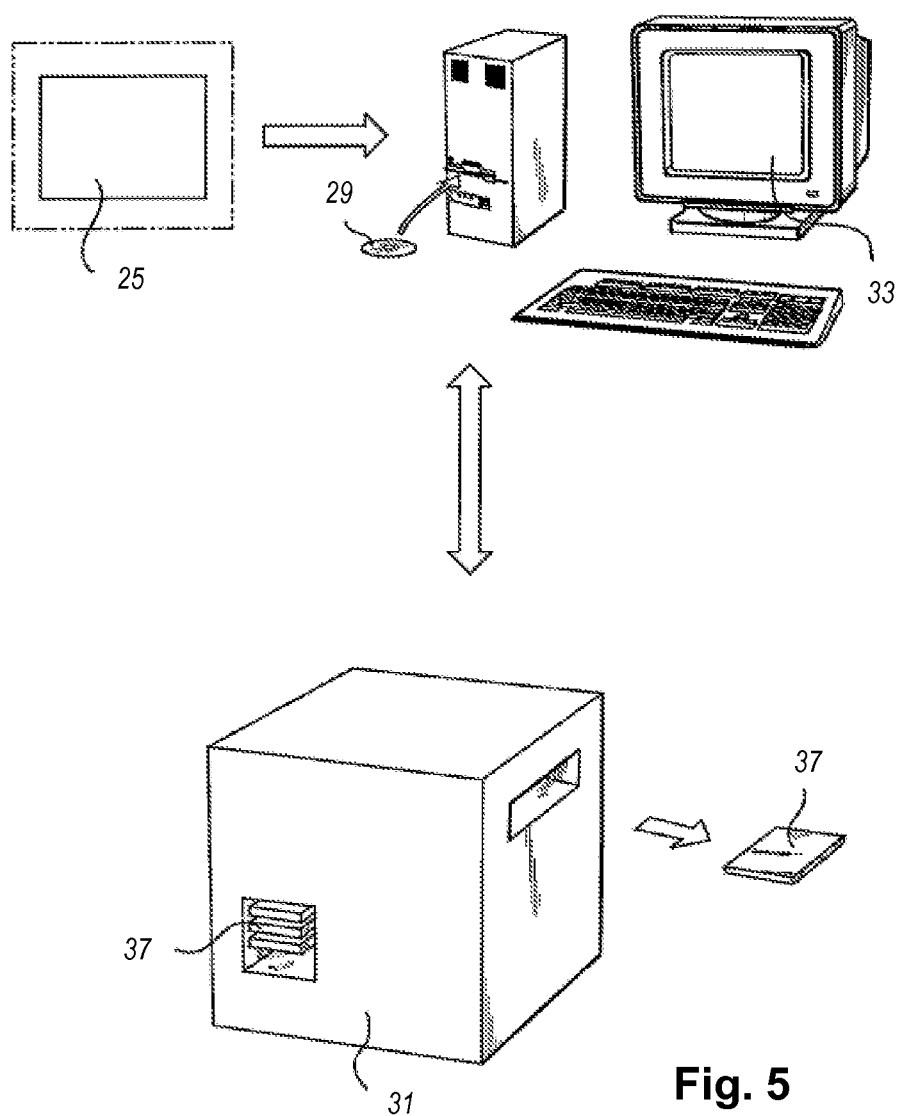
FIG. 5 is a schematic view of a jetting machine and computer wherein the technology disclosed is applicable.

With reference to FIG. 5, there is illustrated a jetting machine 51 in which substrates 57 will be provided with droplets of viscous medium. A software program is run on a computer 53, which communicates with the machine 51. The software program has a database, which holds principal manufacturing data about substrates, e.g. PCBs, machine data for the machine in which the substrates are to be processed. Substrate data 55 about the substrate is imported to the database, preferably in the form of CAD data comprised in a CAD file. The program is adapted for generating a jetting program controlling the jetting process. The software program is available off-line in order for an operator to be able to work with the jetting program generation without interfering with any simultaneous running of the machine control software which is to be provided with the jetting program. The software program may be provided on a computer readable medium which is illustrated by a CD ROM 59 in FIG. 5.

The jetting program for a specific machine, or a plurality of machines that will use the same jetting program, may be generated as follows. First the operator, working on the computer 53 where the software program has been loaded, on basis of the CAD data for a substrate, assigns the components that are to be places on the substrate to the machine by means of the software program. Component data about the components, such as their extension, regarding the housing as well as the leads, if any, and their position on the substrate, is comprised in the substrate data. By opening the machine interface for the present machine on the computer, the operator may begin the procedure of generating data for the jetting program based on the substrate data.

Figure 6:
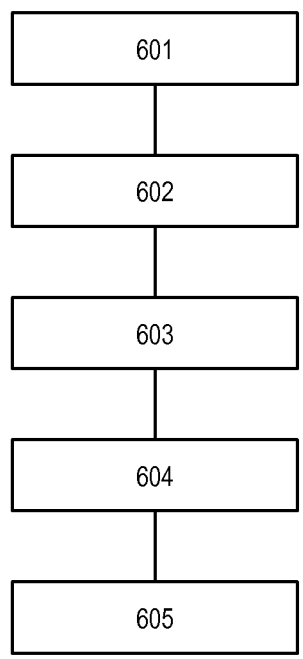
FIG. 6 is a general outline of a method of generating a jetting program.

FIG. 6 is a flowchart illustrating an example of a pre-processing step that generates a jetting program for controlling the jetting process. In a first step 601, the CAD data for a substrate is imported into the software program for off-line pre-processing, wherein the CAD data, in the next step 602, is converted into assembly data which e.g. may describe position and extension of each individual component that is to be assembled. In the next step, the required deposits are defined 603 and assigned to their respective pad or position on the substrate. Once the required deposits are defined 603, the information is compiled 604 into a jetting program which is sent 605 to the jetting machine wherein it may be executed so as to control the jetting process. The jetting program may comprise data for controlling e.g. travelling paths of the ejector(s), and jetting parameters controlling the impact of the impacting device and the feeding of the viscous medium into the nozzle space. Thereby the jetting of droplets of viscous medium may be controlled such that the required deposits are provided.

A repair jetting program, in which printing errors such as e.g. missed shots and droplets having a volume below a predetermined value, may be generated similarly to the jetting program as described with reference to FIG. 6. Upon detection of printing errors, e.g. by use of the sensor arrangement referred to above, a repair jetting program may be generated by defining 603 required deposits based on the detected errors. The repair jetting program may then be compiled 604 and sent 605 to the jetting machine wherein the missing droplets, or erroneous deposits, are complemented by additional jetting. It will be realised that the pre-processing of the repair jetting program may be performed automatically, e.g. by the software program, of include some manual steps performed by an operator.

Figure 7:
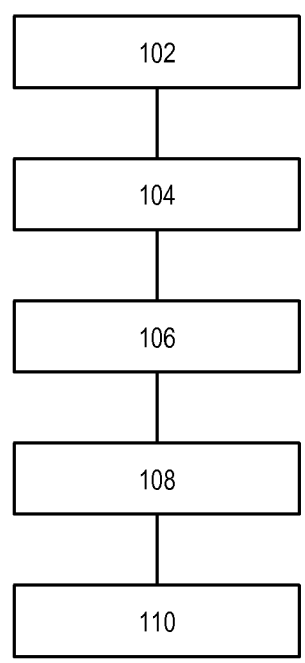
FIGS. 7-10 outline a method of jetting droplets of viscous medium onto a substrate in accordance with an implementation of the technology disclosed.

With reference to FIG. 7, there is shown a general outline of a method of jetting droplets onto a substrate 23 according to an implementation of the technology disclosed.

According to this embodiment, a jetting nozzle 2 comprising a nozzle space 3 and a nozzle outlet 4 is provided 102. After the jetting nozzle 2, in the jetting direction, a sensor arrangement 5 is provided 103, which e.g. comprises an optical sensor device 17, 18. Viscous medium, such as e.g. solder paste, is fed 106 into the nozzle space 3 and impacted 108 by an impacting device such that the viscous medium is jetted from the nozzle space 3 in the form of droplets 22 through the nozzle outlet 4 towards the substrate 23. The method further comprises a step of monitoring 110 a sensor parameter reflecting presence of viscous medium at the sensor arrangement 5.

Figure 8:
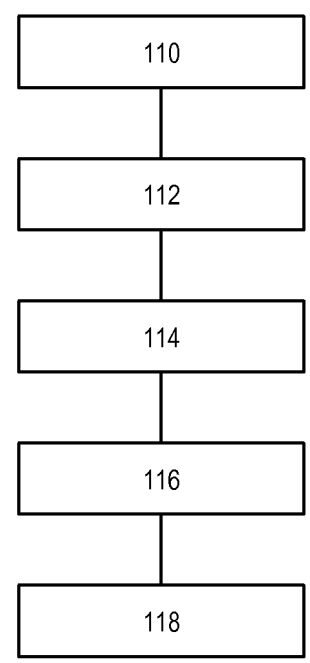

As shown in FIG. 8, the monitored sensor parameter may comprise a sensor value (SV) which indicates presence of viscous medium at the sensor device. Hence, the method as described with reference to FIG. 7 comprise a step of calculating 112 a presence value (PV) identifying the presence of viscous medium at the sensor arrangement. The calculation of the presence value may include a comparison between a sensor value of the sensor parameter and a reference sensor value (SVref). The SVref may e.g. be a threshold indicating whether the sensor value represents presence of viscous medium or not. The presence value (PV) may e.g. be a binary indicator, wherein "1" may define presence of viscous medium and "0" defines absence of viscous medium.

In the next step, a droplet value (DV), identifying a droplet of viscous medium passing the sensor arrangement, is calculated 114 by e.g. comparing at least two presence values (PV) measured at different times. This may for example be achieved by comparing two presence values consecutively registered by the same sensor device. A first PV representing presence of viscous medium, followed by a second PV representing absence of viscous medium, may e.g. indicate that a droplet was passing the sensor device. The calculation may also comprise a comparison of several presence values in order to improve the reliability of the identification and to reduce noise of the measurements.

It will also be realised that passage of a droplet may be identified in several other ways readily understood by a person skilled in the art. For example, the droplet value may be calculated 114 by counting at least two presence values (PV) being equal to or exceeding a reference presence value representing presence of viscous medium at the sensor arrangement.

Further, the passing droplet may be verified as a jetted droplet, i.e. an intentional droplet passing the sensor arrangement due to an impact of the impacting device. This may be achieved by monitoring 116 a lapsed time parameter (LTP) and calculating 118 an impact droplet value (IDV). The lapsed time parameter reflects a lapsed time from the impacting 108 of the impacting device to the identifying 114 of a droplet passing by the sensor arrangement, and the impact droplet value may be calculated 118 by comparing a time value (TV) of the lapsed time parameter (LTP) with a reference time value (TVref). A relatively low time value may e.g. indicate that the passing droplet is passing the sensor arrangement due to the recent impact, whereas a relatively high time value may indicate that the droplet is not passing the sensor arrangement due to the impact.

Figure 9:
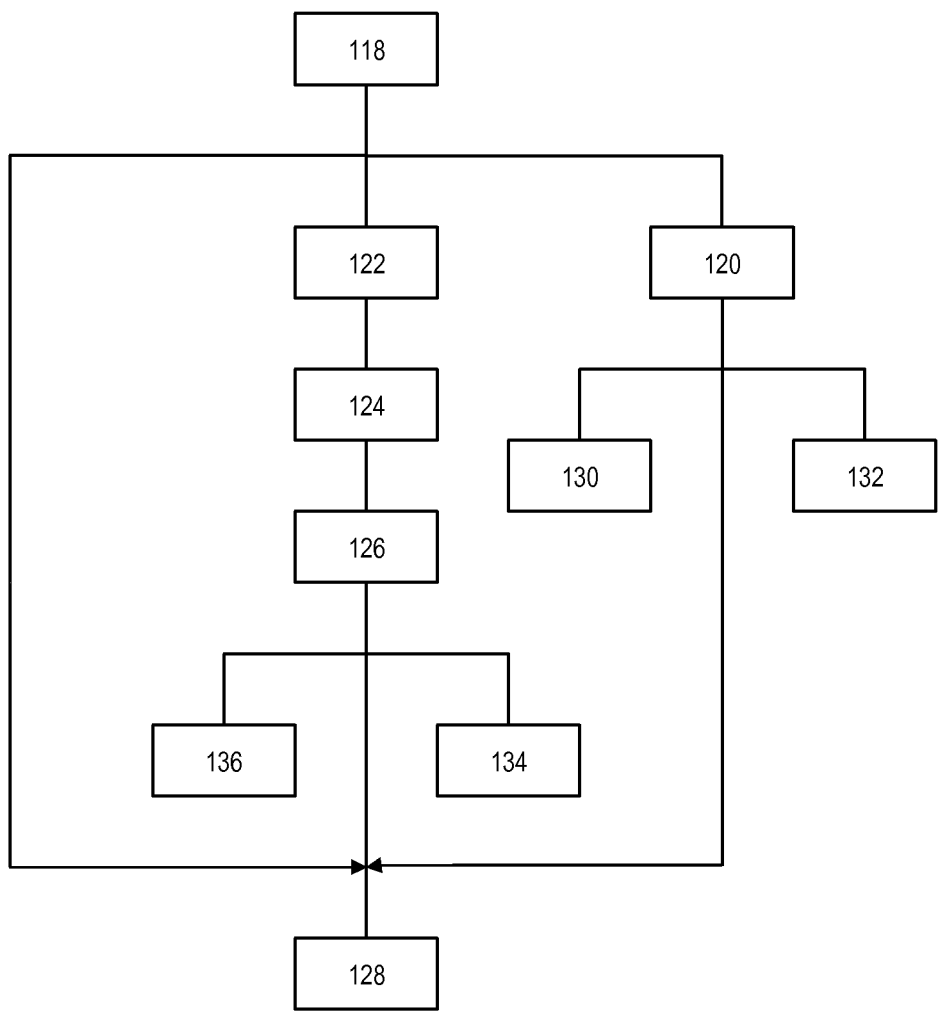

As shown in FIG. 9, the method may further comprise a step of calculating 120 a droplet velocity value (DVV) by means of a time interval defined by the passage of the droplet between at least two sensor devices consecutively arranged in the jetting direction. The calculation 120 includes a comparison between a first presence value (PV) from a first sensor device, and a second presence value (PV) form a second sensor device, which thereby provides the time interval representing the time it takes for the droplet to travel the distance between the first and the second sensor device. By dividing the distance between the sensors in the jetting direction with the timer interval, an average droplet velocity may be obtained.

By using at least two sensor devices consecutively arranged in the jetting direction, both a droplet velocity value (DVV) and a droplet length value (DLV) may be calculated 120, 122. The droplet velocity value (DVV), obtained by comparing a first presence value (PV) from a first sensor device with a second presence value (PV) from a second sensor device, may be used together with a third presence value from either one of the sensor devices to determine the droplet length value (DLV). The first presence value may e.g. represent a front of the droplet, and the third presence value, e.g. obtained from the first sensor device, an end of the droplet. Based on the time interval between the passing of the front and the end of the droplet with the droplet velocity value (DVV), the length—i.e. the distance between the front and the end—of the droplet may be calculated 122.

A sensor arrangement further comprising at least two sensor devices arranged in a plane perpendicular to the jetting direction. By comparing two presence values (PV) from a first and a second sensor device arranged in a plane perpendicular to the jetting direction, wherein the two presence values, the diameter of the droplet may be calculated as a droplet diameter value (DDIAV). A droplet volume value (DVOLV) may then be calculated 126 based on the droplet diameter value (DDIAV) and the droplet length value (DLV).

Supplemental jetting 128 of a droplet of viscous medium onto the substrate may be performed if a jetted droplet due to impact has not been verified 118, if the jetted droplet has a too low velocity, or if the jetted droplet has a too low volume. The additional jetting 128 may e.g. be performed in a separate, correcting printing process, or performed dynamically during the jetting the jetting process.

If the calculated 120 droplet velocity is below a reference droplet velocity value, a step of increasing 130 a strength of the impact of the viscous medium may be performed so as to increase the droplet velocity. Correspondingly, a step of increasing 132 the strength to the impact may performed in response to the calculated 120 droplet velocity being equal to or exceeding the reference droplet velocity value. The adjustment 130, 132 of the impact strength may e.g. be achieved by modifying the applied voltage to the piezoelectric actuator connected to the piston.

In response to a droplet volume value being too low or high, compared with a reference droplet volume value, the method may comprise a step of increasing 134 or decreasing 136, respectively, the feeding rate of the viscous medium into the nozzle space. This may e.g be performed by adjusting the speed of the electric motor operating the feeding screw.

Figure 10:
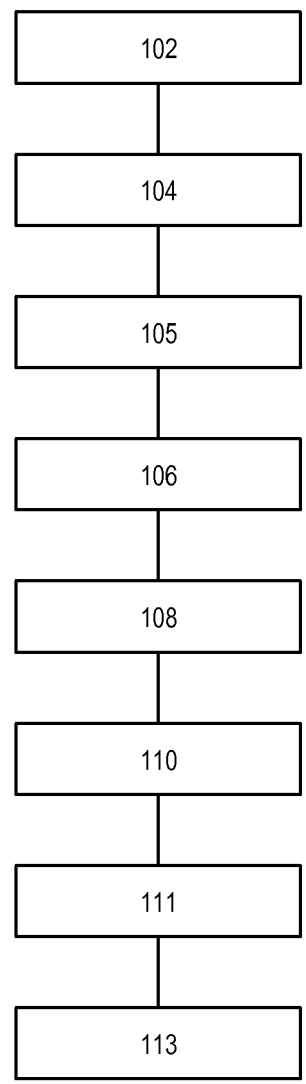

Finally, FIG. 10 shows a method similar to the method as described with reference to FIG. 7, further comprising the step of providing 105 a substrate sensor arrangement directed towards the substrate, monitoring 111 a substrate sensor parameter (SSP) reflecting presence of viscous medium on the substrate, and calculating 113 a substrate presence value (SPV). The calculation includes comparing a substrate presence value (SPV) of the substrate sensor parameter (SPV) with a reference substrate presence value (SPVref) and thereby indentifying presence of viscous medium on the substrate.

It will be appreciated that any one of the embodiments described above with reference to FIGS. 1-4 is combinable and applicable to the any one of the embodiments of the method described herein with reference to FIGS. 7-10.

As outlined above, the method illustrated by FIGS. 7-10 may be embodied as computer-executable instructions distributed and used in the form of a computer-program product including a computer-readable medium storing such instructions. By way of example, computer-readable media may comprise computer storage media and communication media. As is well known to a person skilled in the art, computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices. Further, it is known to the skilled person that communication media typically embodies computer readable instructions, data structures, program modules or other data in a modulated data signal such as a carrier wave or other transport mechanism and includes any information delivery media.

While specific embodiments have been described, the skilled person will understand that various modifications and alterations are conceivable within the scope as defined in the appended claims.

The invention claimed is:

1. An ejector configured to perform a jetting process to jet droplets of viscous media onto a substrate, the ejector comprising:
    a jetting nozzle having a nozzle outlet;
    an impacting device configured to impact a volume of the viscous media in a nozzle space of the jetting nozzle to jet droplets of the viscous media from the nozzle space through the nozzle outlet towards the substrate;
    a sensor arrangement arranged after the jetting nozzle in a jetting direction, the sensor arrangement configured to detect a jetted droplet of viscous media passing thereby prior to deposition of the jetted droplet to a surface of the substrate; and
    a jetting module configured to prepare a repair jetting program automatically and during the jetting process, the repair jetting program prepared based on information detected by said sensor arrangement during said jetting process, said information indicating detection of the jetted droplet having a volume that is outside a reference volume range prior to deposition of the jetted droplet to the surface of the substrate, said repair jetting program configured to cause the ejector to perform a supplemental jetting process to jet a required amount of viscous media onto required positions on said substrate in response to the information detected by said sensor arrangement during said jetting process to supplement viscous media already jetted on said substrate during said jetting process.

2. The ejector according to claim 1, further comprising:
    a vacuum washer arranged after the jetting nozzle in the jetting direction, wherein the sensor arrangement is integrated with the vacuum washer.

3. The ejector according to claim 1, wherein the sensor arrangement comprises an optical sensor device.

4. The ejector according to claim 1, wherein the sensor arrangement comprises
    at least two plane optical sensor devices arranged in a plane perpendicular to a path of the jetted droplet, the at least plane two optical sensor devices configured to measure separate presence values of the jetted droplet at a same time, such that the sensor arrangement is configured to detect information indicating a diameter of the jetted droplet prior to deposition of the jetted droplet to the surface of the substrate based on the separate presence values measured by the at least two plane optical sensor devices at the same time, and
    at least two consecutive optical sensor devices arranged consecutively along the path of the jetted droplets, the at least two consecutive optical sensor devices configured to measure separate presence values of the jetted droplet at different times, such that the sensor arrangement is configured to detect information indicating a length of the jetted droplet prior to deposition of the jetted droplet to the surface of the substrate based on the separate presence values measured by the at least two consecutive optical sensor devices at the different times, and
    the jetting module is configured to prepare the repair jetting program based on
        processing the information detected by said sensor arrangement during said jetting process to calculate the volume of the jetted droplet prior to deposition of the jetted droplet to the surface of the substrate based on the diameter of the jetted droplet and the length of the jetted droplet, and
        determining that the volume of the jetted droplet is outside the reference volume range.

5. The ejector according to claim 1, further comprising:
    a substrate sensor arrangement directed towards the substrate, the substrate sensor arrangement configured to detect jetted droplets of the viscous media on the substrate.

6. The ejector according to claim 1, wherein the impacting device includes a piezoelectric actuator.

7. An ejector configured to perform a jetting process to jet droplets of viscous media onto a substrate, the ejector comprising:
    a jetting nozzle having a nozzle outlet;
    an impacting device configured to impact a volume of the viscous media in a nozzle space of the jetting nozzle to jet droplets of the viscous media from the nozzle space through the nozzle outlet towards the substrate;

a sensor arrangement arranged after the jetting nozzle in a jetting direction, the sensor arrangement configured to detect a jetted droplet of viscous media passing thereby prior to deposition of the jetted droplet to a surface of the substrate; and a jetting module configured to dynamically modify a jetting program to generate a modified jetting program for controlling a printing process during the jetting process based on adding one or several additional shots to said jetting program in response to detection, by said sensor arrangement, of at least one of (i) the jetted droplet having a volume that is outside a reference volume range prior to deposition of the jetted droplet to the surface of the substrate, or (ii) the jetted droplet having a velocity outside a reference velocity prior to deposition of the jetted droplet to the surface of the substrate, wherein the ejector is further configured to execute the one or several additional shots in accordance with the modified jetting program to supplement viscous media already jetted on said substrate during said jetting program.

8. An ejector configured to perform a jetting process to jet droplets of viscous media onto a substrate, the ejector comprising:

a jetting nozzle having a nozzle outlet;

an impacting device configured to impact a volume of the viscous media in a nozzle space of the jetting nozzle to jet droplets of the viscous media from the nozzle space through the nozzle outlet towards the substrate;

a sensor arrangement arranged after the jetting nozzle in a jetting direction, the sensor arrangement configured to detect a jetted droplet of viscous media passing thereby prior to deposition of the jetted droplet to a surface of the substrate; and a jetting module configured to prepare a repair jetting program automatically and during the jetting process, the repair jetting program prepared based on information detected by said sensor arrangement during said jetting process, said information indicating detection of the jetted droplet having a velocity outside a reference velocity interval prior to deposition of the jetted droplet to the surface of the substrate, said repair jetting program configured to cause the ejector to perform a supplemental jetting process to jet a required amount of viscous media onto required positions on said substrate in response to the information detected by said sensor arrangement during said jetting process to supplement viscous media already jetted on said substrate during said jetting process.

9. The ejector according to claim 8, further comprising:

a vacuum washer arranged after the jetting nozzle in the jetting direction, wherein the sensor arrangement is integrated with the vacuum washer.

10. The ejector according to claim 8, wherein the sensor arrangement comprises an optical sensor device.

11. The ejector according to claim 8, wherein the sensor arrangement comprises at least two consecutive optical sensor devices arranged consecutively along a path of the jetted droplets, the at least two consecutive optical sensor devices configured to measure separate presence values of the jetted droplet at different times, such that the sensor arrangement is configured to detect information indicating the velocity of the jetted droplet prior to deposition of the jetted droplet to the surface of the substrate based on the separate presence values measured by the at least two consecutive optical sensor devices at the different times.

12. The ejector according to claim 8, further comprising:

a substrate sensor arrangement directed towards the substrate, the substrate sensor arrangement configured to detect jetted droplets of the viscous media on the substrate.

13. The ejector according to claim 8, wherein the impacting device includes a piezoelectric actuator.

\* \* \* \* \*